(12) United States Patent
Weyers et al.

(10) Patent No.: US 8,958,189 B1
(45) Date of Patent: Feb. 17, 2015

(54) HIGH-VOLTAGE SEMICONDUCTOR SWITCH AND METHOD FOR SWITCHING HIGH VOLTAGES

(71) Applicant: Infineon Technologies Austria AG, Villach (AT)

(72) Inventors: Joachim Weyers, Höhenkirchen (DE); Franz Hirler, Isen (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/963,383

(22) Filed: Aug. 9, 2013

(51) Int. Cl.
    *H02H 3/20*     (2006.01)
    *H02H 9/04*     (2006.01)
    *H01L 27/02*     (2006.01)

(52) U.S. Cl.
    CPC ........ *H01L 27/0255* (2013.01); *H01L 27/0288* (2013.01); *H02H 3/20* (2013.01)
    USPC .......................... 361/91.5; 361/91.1; 361/91.7

(58) Field of Classification Search
    USPC ....................................................... 361/91.5
    See application file for complete search history.

(56) References Cited

U.S. PATENT DOCUMENTS

| | | | | |
|---|---|---|---|---|
| 6,344,958 B1 * | 2/2002 | Morrill | ......................... | 361/91.5 |
| 7,268,992 B2 * | 9/2007 | Hallak et al. | .................. | 361/93.7 |
| 7,602,595 B2 * | 10/2009 | Hiyama | ...................... | 361/93.7 |
| 7,760,479 B2 * | 7/2010 | Garrett | ......................... | 361/93.9 |
| 8,068,322 B2 * | 11/2011 | Bingel et al. | .................. | 361/93.1 |

\* cited by examiner

*Primary Examiner* — Dharti Patel
(74) *Attorney, Agent, or Firm* — Murphy, Bilak & Homiller, PLLC

(57) ABSTRACT

A high voltage semiconductor switch includes a first field-effect transistor having a source, a drain and a gate, and being adapted for switching a voltage at a rated high-voltage level, the first field-effect transistor being a normally-off enhancement-mode transistor, a second field-effect transistor having a source, a drain and a gate, connected in series to the first field-effect transistor, the second field-effect transistor being a normally-on depletion-mode transistor; and a control unit connected to the drain of the first field-effect transistor and to the gate of the second field-effect transistor and being operable for blocking the second field-effect transistor if a drain-source voltage across the first field-effect transistor exceeds the rated high-voltage level.

20 Claims, 6 Drawing Sheets

HIGH-VOLTAGE SEMICONDUCTOR SWITCH AND METHOD FOR SWITCHING HIGH VOLTAGES

TECHNICAL FIELD

Embodiments described herein relate to high-voltage semiconductor switches. Furthermore, embodiments described herein relate to methods for switching high voltages.

BACKGROUND

Switched mode power supplies (SMPS) are widely used for supplying electronic loads to devices such as computers, television sets or any other electronic appliances with a suitable voltage level out of a mains voltage in the range of typically e.g. 90V to 240V rms. Transformers in many cases galvanically decouple the load from the mains and provide the appropriate voltage level at the secondary side consume less space and are more economic if designed for higher frequencies, above the frequency range from 50 Hz to 60 Hz of most AC mains. Electronic switches, e.g. high-voltage MOSFETs or IGBTs are commonly used for providing a primary side of the transformer with appropriate high frequency voltage and current waveforms out of a direct current (DC) link which can be generated by rectifying the mains voltage. It is noted here that the use of such electronic switches is not restricted to the applications mentioned above.

In an electronic switch connected to the primary side of the transformer, when driving the primary side of the transformer with high voltage, high frequency and high current signals, both ohmic losses and switching losses occur. These losses are present when turning-on and especially when turning-off the electronic switch. To reduce the switching losses and at the same time increase an overall efficiency, a number of configurations and methods for driving the transformer have been established. These methods include an operation of a resonant tank wherein the electronic switches mainly are turned-on and/or turned-off close to or at zero crossing of the voltage. Thereby, switching losses can be reduced. Such methods are often referred to as soft switching of the electronic switches. In normal operation, the maximum voltage that is applied to the load terminals during soft switching is the voltage of the DC link. Situations may occur, however, where soft switching conditions are not achieved, e.g. during power-up of the SMPS, load jumps, etc. In these cases, the electronic switch cannot necessarily turn-off close to zero voltage or zero current but at a significant current and/or voltage at the terminals of the electronic switch. In these cases a significant voltage overshoot can occur which exceeds the DC link voltage.

Therefore, conventionally used electronic switches provide a blocking capability which is exceeding the voltage of the DC link. A charge stored between the load terminals of the high-voltage electronic switch, however, increases with increasing blocking requirements of the device. This can adversely affect both the switching losses of the high-voltage electronic switch and the control stability of the SMPS.

The on-state losses of a high-voltage electronic switch having a given chip area can significantly increase with increasing blocking requirements. On the one hand, a width of a drift zone sustaining the voltage across the load terminals will linearly increase with the blocking capability, according to a first order approximation. Furthermore, a reduction of a net doping of the drift zone can be provided in order to improve the blocking capability. As a result, the on-state losses of a high-voltage electronic switch can increase significantly with increasing blocking capability, e.g. the on-state losses of the high-voltage electronic switch can increase disproportionally high with increasing blocking capability.

In view of the above, there is a need for improvement.

SUMMARY

According to an embodiment, a high-voltage semiconductor switch is provided. The high-voltage semiconductor switch includes a first field-effect transistor having a source, a drain and a gate, and is adapted for switching a voltage at a rated high-voltage level, the first field-effect transistor being a normally-off enhancement-mode transistor, a second field-effect transistor having a source, a drain and a gate, connected in series to the first field-effect transistor, wherein the second field-effect transistor is a normally-on depletion-mode transistor; and a control unit connected to the drain of the first field-effect transistor and to the gate of the second field-effect transistor and being operable for blocking the second field-effect transistor if a drain-source voltage across the first field-effect transistor exceeds the rated high-voltage level.

According to an embodiment, a high-voltage semiconductor switch is provided. The high-voltage semiconductor switch includes an integrated semiconductor device having a cell region, an outer rim, and an edge termination region arranged between the outer rim and the cell region, the semiconductor device including a first field-effect transistor having a source, a drain and a gate, and is adapted for switching a voltage at a rated high voltage level; and a Zener diode and a resistor connected in series between the drain and the source of the first field-effect transistor, wherein the Zener diode and the resistor are monolithically integrated in the edge termination region of the integrated semiconductor device; and a second field-effect transistor having a source, a drain and a gate, wherein the second field-effect transistor is connected with its source to the drain of the first field-effect transistor, and, wherein a connection terminal of the Zener diode and the resistor is connected to the gate of the second field-effect transistor.

According to an embodiment, a method of protecting a high-voltage enhancement mode switching transistor against overvoltage is provided. The method includes providing a series connection of an enhancement mode field-effect transistor including a source, drain, and gate, and a depletion mode field-effect transistor including a source, drain, and gate, wherein the source of the depletion mode field-effect transistor is connected to the drain of the enhancement mode field-effect transistor, supplying a high voltage between the drain of the depletion mode field-effect transistor and the source of the enhancement mode field-effect transistor, switching the high voltage in a normal operation mode by applying a switching signal to the gate of the enhancement mode field-effect transistor; and, switching from the normal operation mode to a protection mode by switching-off the depletion mode field-effect transistor if an overvoltage is detected at the drain of the enhancement mode field-effect transistor.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead the figures illustrate principles of embodiments of the FIG. 1 illustrates a cascode circuit including a first field-effect transistor and a second field-effect transistor connected to a control unit, according to an embodiment.

DETAILED DESCRIPTION

Figure 1:
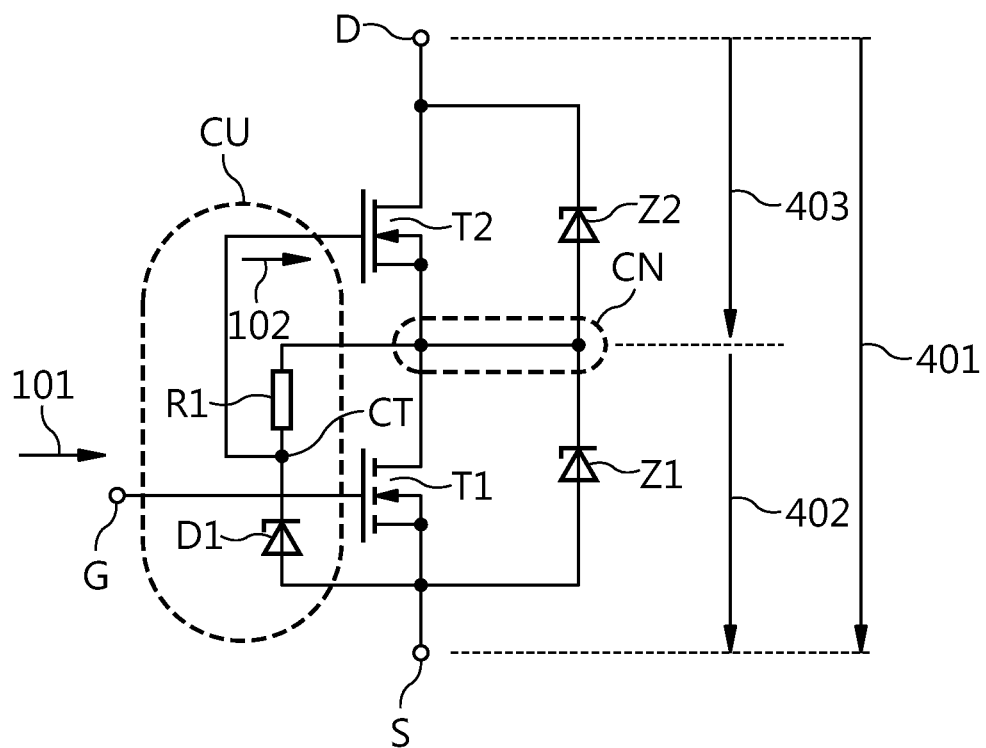

In the following Detailed Description, reference is made to the accompanying drawings, which form a part hereof, and in which are shown by way of illustration specific embodiments in which the invention can be practiced. In this regard, directional terminology, such as "top," "bottom," "front," "back," "leading," "trailing," lateral, vertical, etc., is used with reference to the orientation of the Figure(s) being described. Because components of embodiments can be positioned in a number of different orientations, the directional terminology is used for purpose of illustration and is in no way limiting. It is to be understood that other embodiments can be utilized and structural or logical changes can be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

In the drawings the lateral direction is denoted by a reference numeral x. Moreover, in the drawings the vertical direction is denoted by a reference numeral y.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include electrically conductive materials such as, but not restricted to, metal, alloys, doped polycrystalline semiconductors and metal semiconductor compounds such as metal silicides.

Field-effect controlled switching devices such as Metal Oxide Semiconductor Field-effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched on FET, i.e., the source-drain voltage is desired to be low. On the other hand, the losses occurring during switching off or commutating of the FET are often also to be kept small to minimize the overall losses.

The term "semiconductor power switch" as used in this specification intends to describe a semiconductor device on a single chip with high voltage and/or high current switching capabilities. In other words, power semiconductor devices are intended for high current, typically in the Ampere range. Within this specification the terms "semiconductor power switch", "solid-state switching device" and "power semiconductor device" are used synonymously.

In the context of the present specification, a semiconductor region in which an inversion channel can be formed and/or controlled by the field-effect is also referred to as body region.

The term "field-effect" as used in this specification intends to describe the electric field mediated formation of an "inversion channel" and/or control of conductivity and/or shape of the inversion channel in a semiconductor region. The conductivity type of the channel region is typically changed, i.e., inverted, for forming a unipolar current path between two semiconductor regions of the inverted conductivity type which are adjacent to the channel region.

In the context of the present specification, the term "field-effect structure" intends to describe a structure which is formed in a semiconductor substrate or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$).

In the context of the present specification, the term "gate electrode" intends to describe an electrode which is situated next to, and insulated from the body region and configured to form and/or control a channel region through the body region. The terms "electrical connection" and "electrically connected" describes an ohmic connection between two elements.

In the context of the present specification, the term "Zener diode" intends to describe a diode limiting the blocking voltage across its anode and cathode electrode by generating a current flow either by avalanche multiplication or by tunneling. Thereby, the term "Zener diode" as used herein is used as a synonym, e.g. for "avalanche diode" or "Tunnel diode" or the like. "Zener voltage" in this context intends to describe the voltage limited by a Zener diode or a breakdown voltage of the Zener diode according to the definition above.

As used herein, the term "voltage-limiting element" intends to describe an electronic component capable of limiting a voltage applied across two of its terminals, to a specified voltage level. Examples of such voltage-limiting elements are Zener diodes described herein above.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

The terms "electrical connection" and "electrically connected" describes an ohmic connection between two elements.

As used herein, the term "cascode circuit" is intended to be representative of a circuit configuration wherein two transistors are connected in series, and wherein the gate terminal of one of the two transistors can be used as a control terminal for switching through a conduction path represented by the series connection of the two transistors.

A compensation circuit element having a charge compensation structure with alternating n columns and p columns in the drift region such as an enhancement mode field-effect transistor having a superjunction structure (SJ FET) operates with a high value of output charge. This fact results from a high doping of n-regions which carry a load current of the transistor and a high doping of p-regions substantially matching the doping of the n-regions when integrating the amount of n- and p-doping atoms in the drift region, respectively, and substantially carrying no current when the device is switched on. High n-doping results in a lower charge carrier mobility. The lower charge carrier mobility can be compensated by a larger amount of charge carriers which are removed when the device is switched off. During turning-off, charge carriers stored in the device are removed to bring the device into the blocking state. Thus, a non-conducting space-charge region can be obtained. The amount of charge carriers which are removed for switching off the device results in an output charge herein denoted by Qoss. The output charge Qoss exhibits a substantially linear dependence from a chip area.

In the design of high-voltage switching devices it is desired to provide a good high-voltage blocking capability and a low on-resistance (Ron). Power semiconductor devices can include a drift region arranged between a body region and a drain region. The on-resistance of such kind of high-voltage semiconductor switching device increases with increasing length of a current path through the drift region and with decreasing doping concentration in the drift region. In order to obtain a low on-resistance (Ron), n regions in the SJ FET can be highly doped, wherein at the same time a width of the n columns can be reduced. A reduction of the widths of both n columns and p columns in the drift region results in a reduced pitch of the compensation circuit element. Thereby, a product of the on-resistance and the output charge Ron×Qoss representing a characteristic value of the compensation circuit element is increased.

On the other hand, the high-voltage blocking capability decreases with a decreasing length of the drift region and an increasing doping concentration in the drift region. For superjunction structures, this holds true not for e.g. the n-doping alone but for a mean overall doping, i.e. the mathematically integrated difference of the n-doping and the p-doping in the drift region that is typically lower than the maximum or mean doping concentration of the n-doping alone. Since the mean overall doping must not exceed a certain limit and is depending on the accuracy by which the n- and p-doping can be adjusted, there is a trade-off between a low on-resistance and a high-voltage blocking capability of a compensation circuit element. An area-specific output charge, i.e. an output charge related to an element area A (chip area) exhibits a substantially linear dependence from an active thickness of the circuit element, and thus, from the blocking voltage. As an example, a compensation circuit element providing a blocking voltage capability of 600 V operates with an output charge Qoss which is increased by 20% as compared to a similar dimensioned compensation circuit element providing a blocking voltage capability of 500 V. Thereby, if a reduction of the blocking voltage capability can be achieved, output charge can be reduced.

Moreover, an area specific on-resistance, i.e. a resistance related to the chip area A, increases with increasing blocking voltage Vb according to the following equation:

$$Ron \sim Vb^{2.5}. \tag{1}$$

Thus, a reduction in permissible blocking voltage Vb can reduce the on-resistance Ron to a large extent. In other words, e.g., if a compensation circuit element #1 having a blocking voltage capability of 400 V is compared to a compensation circuit element #2 having a blocking voltage capability of 600 V, and if both compensation circuit elements provide the same on-resistance Ron, then the compensation circuit element #2 only takes up 36% of the chip area as compared to the compensation circuit element #1. In addition, the output charge Qoss of the compensation circuit element #2 is reduced as compared to the compensation circuit element #1. The relation for the on-resistance according to equation (1) is an approximation and is valid for the same type of technology, i.e. if two superjunction technologies for the two voltage classes are compared, then the area specific on-resistances are governed by equation (1) if same accuracy limits of the compensation between n- and p-doping are considered.

With reference to FIG. 1, a first embodiment of a high-voltage semiconductor switch 100 is described. FIG. 1 illustrates a cascode circuit including a first field-effect transistor T1 and a second field-effect transistor T2 connected to a control unit CU, according to an embodiment.

The first field-effect transistor T1 includes a source, a drain and a gate, and is adapted for switching a voltage 401 at a rated high-voltage level. The second field-effect transistor T2 includes a source, a drain and a gate and is connected in series to the first field-effect transistor T1. The second field-effect transistor T2 is adapted to protect the first field-effect transistor T1 against overvoltage. According to an embodiment, the rated high voltage level that can be switched by the second field-effect transistor T2 is lower than the rated high voltage level that can be switched by the first field-effect transistor T1. Therefore, the second field-effect transistor T2 can be dimensioned for lower breakdown voltages as compared to the first field-effect transistor T1. In other words, the second field-effect transistor T2 can be provided with a lower blocking voltage capability than the first field-effect transistor T1.

The first field-effect transistor T1 is connected in series to the second field-effect transistor T2 in a way such that the drain of the first field-effect transistor T1 is connected to the source of the second field-effect transistor T2 at a common note CN. A drain-source voltage drop at the transistor T1 is denoted by a reference numeral 402, wherein a drain-source voltage drop at the transistor T2 is denoted by a reference numeral 403. Thus, a total drain-source voltage drop of the high-voltage semiconductor switch is represented by a reference numeral 401. The voltage 401 can be applied between a first terminal, i.e. the source S of the first field-effect transistor T1, and a second terminal, i.e. the drain D of the second field-effect transistor T2.

The control unit CU is connected to the drain of the first field-effect transistor T1, and thus to the common node CN, and to the gate of the second field-effect transistor T2. The control unit is adapted for blocking the second field-effect transistor T2 if the drain-source voltage 402 across the first field-effect transistor T1 exceeds the rated high-voltage level.

According to an embodiment, the cascode circuit shown in FIG. 1 includes a compensation circuit element in the form of the first field-effect transistor T1 and a self-conducting circuit element in the form of the second field-effect transistor T2. In other words, the first field-effect transistor T1 can be provided as a normally-off enhancement mode transistor, wherein the second field-effect transistor T2 can be provided as a normally-on depletion mode transistor.

The normally-off enhancement mode transistor T1 is combined with the normally-on depletion mode transistor T2. A first voltage-limiting element, e.g. a first Zener diode Z1 is connected in parallel to the source-drain path of the first field-effect transistor T1, whereas a second voltage-limiting element, e.g. a second Zener diode Z2 is connected in parallel to the source-drain path of the second field-effect transistor T2. The two Zener diodes Z1 and Z2 indicate a voltage blocking property of the respective transistors T1 and T2. According to an embodiment, the Zener diodes Z1 and/or Z2 can be regarded as an inherent constituent of the transistors T1 and/or T2, respectively. According to another embodiment, the Zener diodes Z1 and/or Z2 are not present as independent devices but are replaced—with respect to their voltage limiting function—by the breakdown of the transistors T1 and/or T2, respectively.

As shown in FIG. 1, the control unit includes a voltage-limiting element such as a Zener diode D1 and a resistor R1 connected in series between the drain and the source of the first field-effect transistor T1. A common connection terminal CT of the Zener diode D1 and the resistor R1 is connected to the gate of the second field-effect transistor T2. If the voltage drop 402 across the first field-effect transistor T1, i.e. the drain-source voltage of the first field-effect transistor T1 exceeds a predetermined high-voltage level, then the Zener diode D1 clamps a potential at the control terminal CT to its Zener voltage (breakdown voltage). This clamping results in a change of the voltage potential at the connection terminal CT connecting one terminal of the resistor R1 and the cathode terminal of the Zener diode D1 compared to the potential at the common node CN. Thereby, the voltage potential at the connection terminal is substantially at Zener voltage of the diode D1. Thus, the gate of the second field-effect transistor T2 connected in series to the first field-effect transistors T1 substantially assumes the potential of the Zener voltage.

In a normal operation or switching mode, the source S of the first field-effect transistor T1 is connected to negative potential or ground, wherein the drain of the second field-effect transistor T2 is connected to a positive voltage to be switched. As the second field-effect transistor T2 is provided as an n-type depletion transistor, a transit into its off-state is performed if the potential applied at its gate terminal is negative with respect to the potential applied at its source terminal.

According to an embodiment, the high-voltage semiconductor switch 100 can include the second field-effect transistor T2 being provided as one of an n-channel MOSFET, a JFET, and a HEMT. The first field-effect transistor T1 can be selected from the group consisting of an n-channel MOSFET, an IGBT, a JFET, and a HEMT. The MOSFETs for use as the first and/or second field-effect transistor T1 and/or T2 can be designed as superjunction transistors according to an embodiment.

In the normal operation mode, only the first field-effect transistor T1 is switched by means of a switching signal applied at its gate. The normal operation mode continues until a voltage level at the drain of the first field-effect transistor T1 exceeds a rated or predetermined voltage level. As an example, the rated voltage level is +390 V with respect to ground, i.e. with respect to the source potential of the first field-effect transistor T1. Thus, due to the voltage-limiting property of the Zener diode D1, a voltage level at the gate of the second field-effect transistor T2 is clamped at +390 V, whereas at the drain of the transistor T2 a voltage level exceeding the rated voltage level can be present. Thereby, the semiconductor switch transits to a protection mode, where the second field-effect transistor T2 is blocked.

The high voltage 401 is applied between the drain D of the second field-effect transistor T2 and the source S of the first field-effect transistor T2, wherein the source of the second field-effect transistor T2 and the drain of the first field-effect transistor T1 are electrically connected to the common node CN. If the drain-source voltage across the first field-effect transistor T1 no longer exceeds the rated high-voltage level, the negatively charged gate of the second field-effect transistor T2 is discharged via the resistor R1. Then, the second field-effect transistor T2 again transits to its normally-on state and the normal operation mode is resumed.

In other words, the method of protecting the high-voltage enhancement mode switching transistor T1 against overvoltage can include providing a series connection of the enhancement mode field-effect transistor T1 and the depletion mode field-effect transistor T2 by connecting the source of the depletion mode field-effect transistor T2 to the drain of the enhancement mode field-effect transistor T1, wherein the high voltage 401 is applied between the drain D of the depletion mode field-effect transistor T2 and the source S of the enhancement mode field-effect transistor T1.

Switching the high voltage is provided in a normal operation mode by applying a switching signal 101 at the gate G of the enhancement mode field-effect transistor T1. If an overvoltage is detected at the drain of the enhancement mode field-effect transistor T1, i.e. at the common node CN, switching from the normal operation mode to a protection mode is performed. In the protection mode, the depletion mode field-effect transistor is switched off. Thereby, the control unit CU can provide a transition from the normal operation mode where the applied high voltage is switched, to the protection mode where the high-voltage switching operation is blocked. On the basis of the drain-source voltage of the first field-effect transistor T1 the control unit CU generates a control signal 102 for the gate of the second field-effect transistor T2.

As an example, the first field-effect transistor T1 can have an area-specific on-resistance of $Ron \times A = 400$ m$\Omega \times$mm$^2$ and a blocking voltage capability of 400 V, and the second field-effect transistor T2 can have an area-specific on-resistance of RonxA=260 mΩ×mm$^2$ and a blocking voltage capability of 200 V. Furthermore, the second field-effect transistor T2 according the above example can take up 80% of the chip area of the first field-effect transistor T1. Then, a total blocking voltage capability of 600 V can be achieved by means of the series connection of the two field-effect transistors T1 and T2, respectively. Compared to a conventional power semiconductor switching transistor having, e.g. an area-specific on-resistance of RonxA=1000 mΩ×mm$^2$ and a blocking voltage capability of 600 V the series connection of the two field-effect transistors T1 and T2 according to FIG. 1 can provide an output charge Qoss which only amounts to 50% of the output charge present in the conventional power semiconductor switching transistor.

Figure 2:
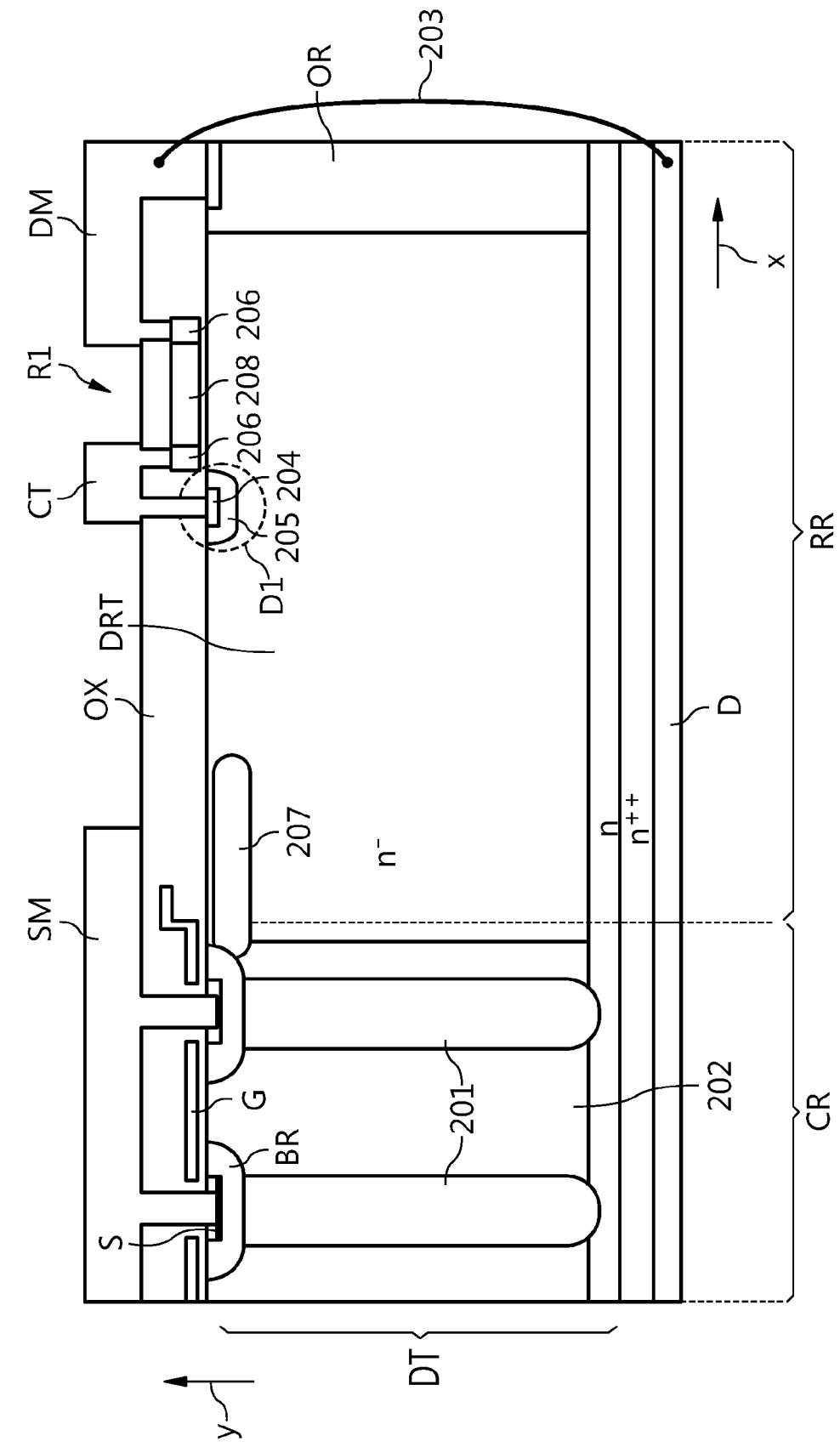
FIG. 2 illustrates a cross section of an integrated semiconductor device, according to an embodiment.

FIG. 2 illustrates a cross section of an integrated semiconductor device 200, according to an embodiment. In the cross section of FIG. 2, a reference numeral x denotes a lateral direction, wherein a reference numeral y denotes a vertical direction. Thereby, the x-direction as used in this specification describes an orientation substantially parallel to the main surface of the semiconductor substrate, whereas the y-direction describes an orientation, which is arranged substantially perpendicular to the main surface of the semiconductor substrate.

As shown in FIG. 2, the integrated semiconductor device 200 is laterally subdivided into a cell region CR, an outer rim OR and an edge termination region RR or rim region. The edge termination RR is arranged between the outer OR rim and the cell region CR. The cell region CR includes a drift region DT which can provide a superjunction structure of the transistor in form of alternating p-doped columns 201 and n-doped columns 202. Thereby, the cell region CR includes main portions of the superjunction field-effect transistor having the p-doped columns 201 and the n-doped columns 202, and controlling cells where a gate electrode G controls an inversion channel in a body region BR. The edge termination region RR provides a drift region termination DRT. In the drift region termination DRT of the edge termination region RR (rim region) a structure of alternating p-doped columns and n-doped columns can be provided as well, although not shown in FIG. 2. FIG. 2 shows the drift region termination DRT of the edge termination region RR with a low doping concentration. The semiconductor device 200 shown in FIG. 2 includes a drain D in form of a substrate and a number of epitaxial layers n++, n, and n− forming the drift regions, i.e. the drift region DT in the cell region CR, and the drift region termination DRT in the edge termination region RR, respectively, in a vertical structure. A source electrode S is connected to a source metallization SM adapted for a connection of external circuit components. A gate terminal G is embedded in a dielectric layer, e.g. an oxide layer OX. The dielectric layer OX can include silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$), or any combinations thereof.

In the drift region DT adjacent to the source S, a body region BR is provided. A lateral p-doped junction termination extension region 207 extends from the last p-column 201 of the cell region CR and further laterally extends into the edge termination region RR. According to an embodiment, the Zener diode D1 is monolithically integrated in the edge termination region RR, according to an embodiment, in the drift region DRT of the edge termination region RR of the integrated semiconductor device 200. In other words, the Zener diode D1 can be regarded as an inherent constituent of the edge termination region RR. As shown in FIG. 2, the Zener diode D1 is formed by n-well region 205 and a p+ region 204, the n-well region 205 and the p+ region 204 being embedded in the drift region termination DRT. A voltage potential at a cathode of the Zener diode D1 is accessible at the connection terminal metallization CT. Thereby, a pn-junction is formed.

Thereby, the p+ region 204 of the Zener diode D1 can probe the potential of the space-charge region of the device. An adjustment of the voltage potential, at which the space-charge region comes close to the p+ region 204, can be provided by an appropriate doping level of the n-well region 205. Examples of an adjustment of the voltage potential, at which the space-charge region comes close to or in contact with the p+ region 204, on the basis of the doping level of the n-well region 205, are described herein below with respect to FIGS. 3 and 4. At the connection terminal metallization CT, the gate of the second field-effect transistor T2 which can be provided as a separate, discrete circuit element, can be electrically connected.

According to another embodiment, the resistor R1 is monolithically integrated in the edge termination region RR of the integrated semiconductor device 200. As shown in FIG. 2, the resistor R1 is formed as an n-region 208 between two n+ regions 206, the regions 206 and 208, respectively, being embedded in the dielectric layer OX. Due to a dielectric isolation of the resistor R1 with respect to the substrate, the resistor R1 is protected against disturbances.

A metallization structure can be used as the connection terminal CT described herein above with respect to FIG. 1. The metallization structure of the connection terminal CT contacts both one of the n+ regions 206 of the resistor R1 and the p+ region of the Zener diode D1. The other n+ region 206 the resistor R1 is connected to the drain metallization DM provided at the right side of the edge termination region RR of the integrated semiconductor device 200. The drain metallization DM is electrically connected to the drain terminal D of the integrated semiconductor device 200 by means of a lead connector 203 or a doped semiconductor region, e.g. in the outer rim OR.

According to an alternative, the resistor R1 can be provided as a polysilicon n+/n−/n+ structure, embedded in the dielectric layer OX. Thereby, the polysilicon resistor R1 can be formed on a gate oxide and/or on a field oxide. According to another embodiment, the n region 208 and the n+ regions 206 are not formed as semiconductor regions but as conductor regions with an appropriate resistance.

A method of manufacturing an integrated semiconductor device 200 can include the steps of providing a semiconductor substrate having a surface, forming an optional first epitaxial layer n++ on the surface of the semiconductor substrate, forming a second epitaxial layer n on the first epitaxial layer n++, and forming a weakly n-doped drift region DT in the cell region CR and/or a weakly n-doped drift region termination DRT in the edge termination region RR, on the second epitaxial layer n+. According to another embodiment, the first epitaxial layer n++ is omitted and the second epitaxial layer is directly applied to the substrate. In the cell region CR, p-doped columns and n-doped columns connected to the body region BR are formed. In the edge termination region RR arranged between the outer rim OR and the cell region an n-well region 205 and a p+ region 204 are formed, the n-well region 205 and the p+ region 204 forming the Zener diode D1 and being embedded in the drift region termination DRT. Thereby, the Zener diode D1 in monolithically integrated in the semiconductor device 200. Furthermore, the method includes the steps of forming a body region BR on the p-doped column, forming a source region S in the body region BR, forming a dielectric layer OX on the drift regions DT and DRT, providing a gate region G isolated from the source region, in the cell region CR, forming a n-region 208 between two n+ regions 206, the regions 206 and 208, respectively, being embedded in the dielectric layer OX and forming the polysilicon resistor R1, electrically connecting one of the two n+ regions 206 to the p+ region 204 of the Zener diode D1, and electrically connecting the other one the two n+ regions 206 to a drain metallization DM provided at outer rim OR. Thereby, the resistor R1 is monolithically integrated in the semiconductor device 200. The source region S can be electrically connected to a source electrode or source metallization, wherein the gate region can be connected to a gate electrode. Furthermore, the first epitaxial layer n++ can be electrically connected to a drain electrode D. Thereby, the integrated semiconductor device 200 includes the transistor T1 which has the source electrode, the drain electrode, and the gate electrode, and a series connection of the resistor R1 and the Zener diode D1. The transistor T1 is formed predominantly in the cell region CR, whereas the resistor R1 and the Zener diode D1 are formed in the edge termination region RR. As shown in FIG. 2, the drain electrode D is electrically connected, via the lead connector 203, to the drain metallization DM formed in the edge termination region RR and in the outer rim OR. According to another embodiment, the connection of the drain electrode D to the drain metallization DM can be formed via a doping region in the semiconductor body, e.g. in the outer rim OR of the integrated semiconductor device 200. The drain metallization DM is further connected to the series connection of the resistor R1 and the Zener diode D1. Thereby, the n-well region of the Zener diode D1 can probe the potential difference between the drain electrode D and the source S of the transistor T1, i.e. drain-source voltage at the transistor T1.

According to another embodiment, the resistor R1 and/or the Zener diode D1 can be designed as discrete circuit elements provided separately from the chip region of the first field-effect transistor T1. The first field effect transistor T1, the second field-effect transistor T2, the separate Zener diode D1 and the separate resistor R1 can then be arranged, e.g. within a common multi-chip package.

Figure 3:
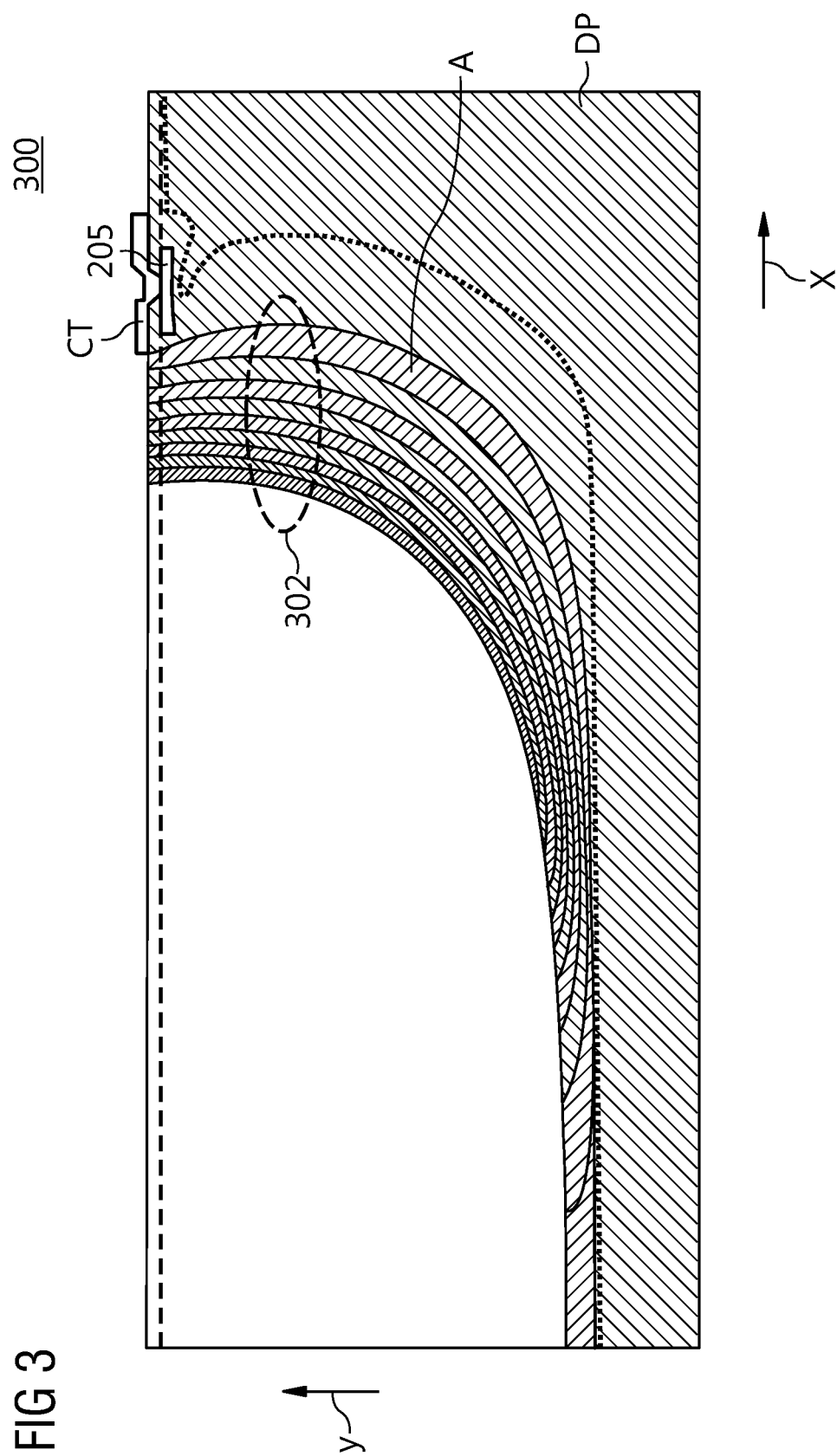
FIG. 3 illustrates a voltage potential distribution graph for an integrated semiconductor device, according to an embodiment.
Figure 4:
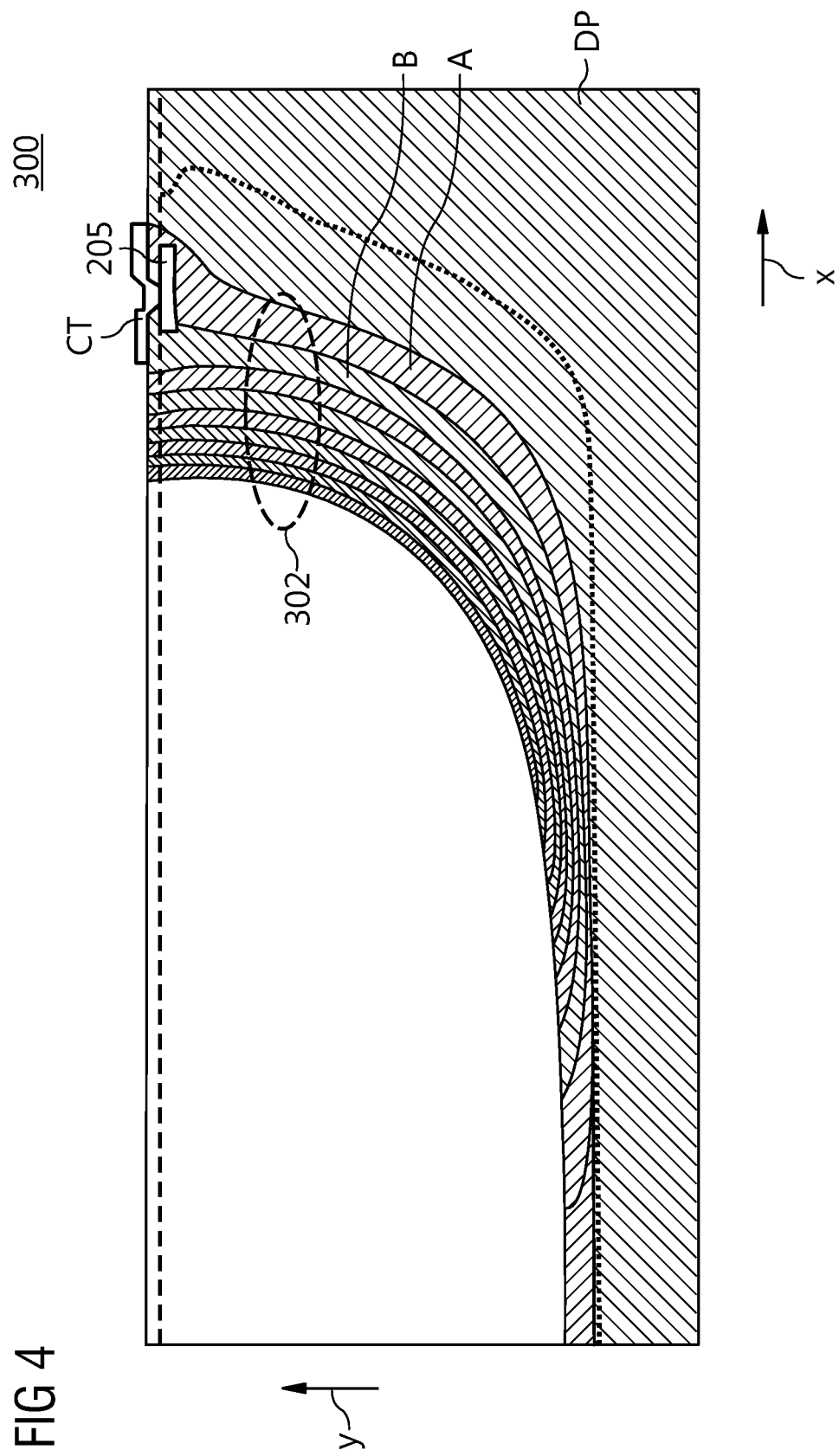
FIG. 4 illustrates another voltage potential distribution graph for an integrated semiconductor device, according to an embodiment.

Referring now to FIGS. 3 and 4, voltage potential distribution graphs 300 in the cross section of the integrated semiconductor device 200, predominantly in a space-charge region, according to an embodiment are illustrated. FIG. 3 shows a voltage potential distribution graph 300 for a situation, where the n-well region 205 has an integral doping level of approximately $10^{12}$ cm$^{-2}$, whereas FIG. 4 shows a voltage potential distribution graph 300 for a situation, where the n-well region 205 has an integral doping level of approximately $5 \times 10^{11}$ cm$^{-2}$. The term "integral doping level" as used herein intends to describe a spatial integration of the n-doping in the n-well region 205 in a vertical direction starting at the first surface and reaching into the semiconductor body until the background doping of the drift region termination DRT is reached. The voltage potential distribution graphs 300 exhibit simulated equipotential lines 302 representing lines of constant voltage potential, related to a drain potential DP of the first field-effect transistor T1.

The equipotential lines 302 are shown superposed onto a cross section of the integrated semiconductor device 200 shown in FIG. 2. The drain potential DP (large area on the right side of FIG. 3) corresponds to the drain-source voltage drop 402 across the transistor T1, see FIG. 1. As can be seen in FIG. 3, a diode field terminal CT of the Zener diode D1, which corresponds to the connection terminal CT described herein above with respect to FIG. 2 is at drain potential DP. A region indicated by the reference numeral A in the voltage potential distribution graph 300 approaches the diode field terminal CT, if—according to the presented sample simulation—a doping of the n-well region 205 amounts to approximately $10^{12}$ cm$^{-2}$.

On the other hand, if a doping level of approximately $5 \times 10^{11}$ cm$^{-2}$ is provided, as shown in FIG. 4, a potential B lower than the potential A with B<A can approach the diode field terminal CT. Thus, potential distribution in the cross section of the integrated semiconductor device 200 can be adjusted by adapting the doping level of the n-well region 205. In this way, an effective limiting or Zener voltage of the Zener diode D1 can be adjusted, and thus, the transition between the normal operation mode and the protection mode of the high-voltage switch 100 can be controlled. According to an embodiment, the voltage of the transition between the normal operation mode and the protection mode is lower than the possible blocking voltage of the transistor T1.

Figure 5:
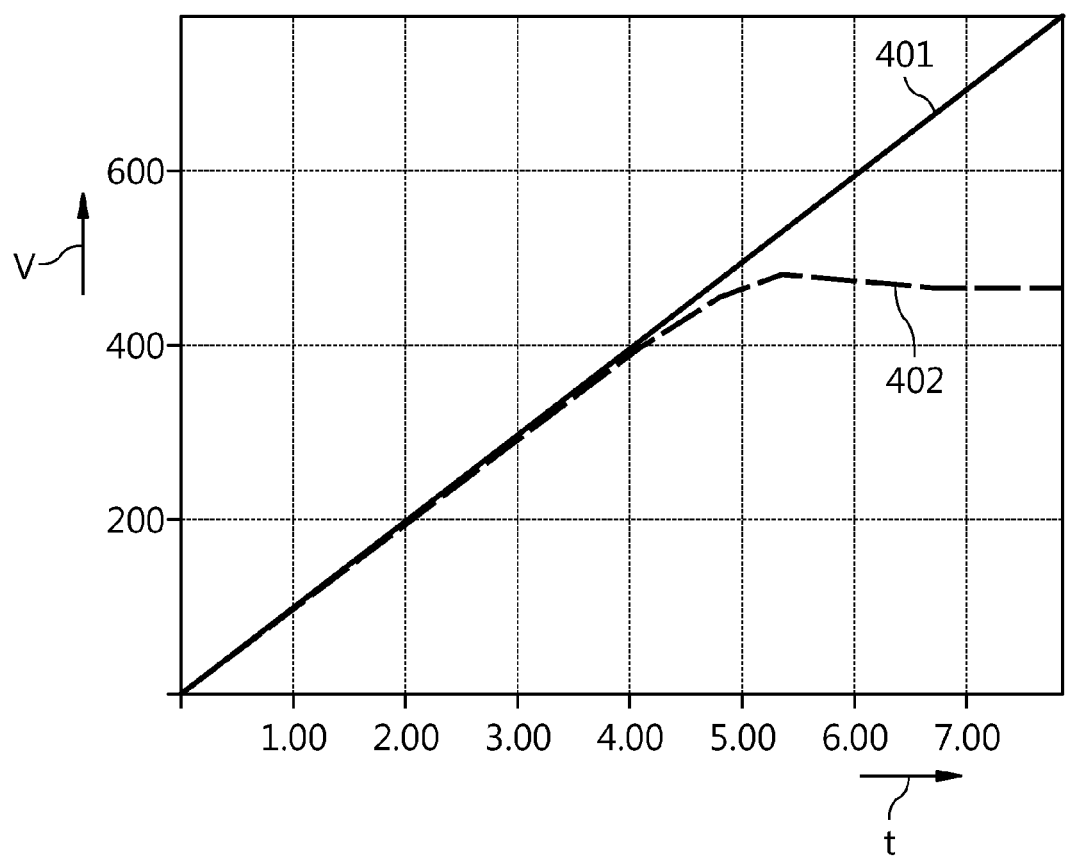
FIG. 5 illustrates a voltage drop graph showing voltage drops at the high-voltage semiconductor switch, according to an embodiment.

FIG. 5 illustrates a voltage drop graph showing voltage drops at the high-voltage semiconductor switch 100, according to an embodiment. Two voltage drop curves V are indicated in the Figure, wherein the reference numeral V denotes a voltage in volts, wherein a reference numeral t represents a time in arbitrary units.

A first curve illustrates a total voltage drop evolution 401 over time t. The total drain-source voltage drop 401 is present across the high-voltage switch 100 shown in FIG. 1, i.e. between the drain D of the second field-effect transistor T2 and the source S of the first field-effect transistor T1.

On the other hand, a second curve depicts a voltage drop 402 across the first transistor T1, i.e. a voltage between the drain terminal of the first field-effect transistor T1 or the common node CN, and the source of the first field-effect transistor T1.

As can be seen from the voltage drop curves 401 and 402, respectively, the control unit CU clamps the voltage 401 across the first transistor to a rated voltage level, in the example to which FIG. 5 relates, to a voltage of approximately 480 V. Thereby, the first field-effect transistor T1 is protected against overvoltages above approximately 480 V which can occur at the drain-source path D-S of the high-voltage semiconductor switch 100 illustrated in FIG. 1.

The high-voltage semiconductor switch 100 can be used in connection with superjunction field-effect transistors for protecting these types of transistors against overvoltages. Thereby, the second field-effect transistor T2 can be used for protecting the first field-effect transistor T1 which can be designed as a superjunction FET.

Figure 6:
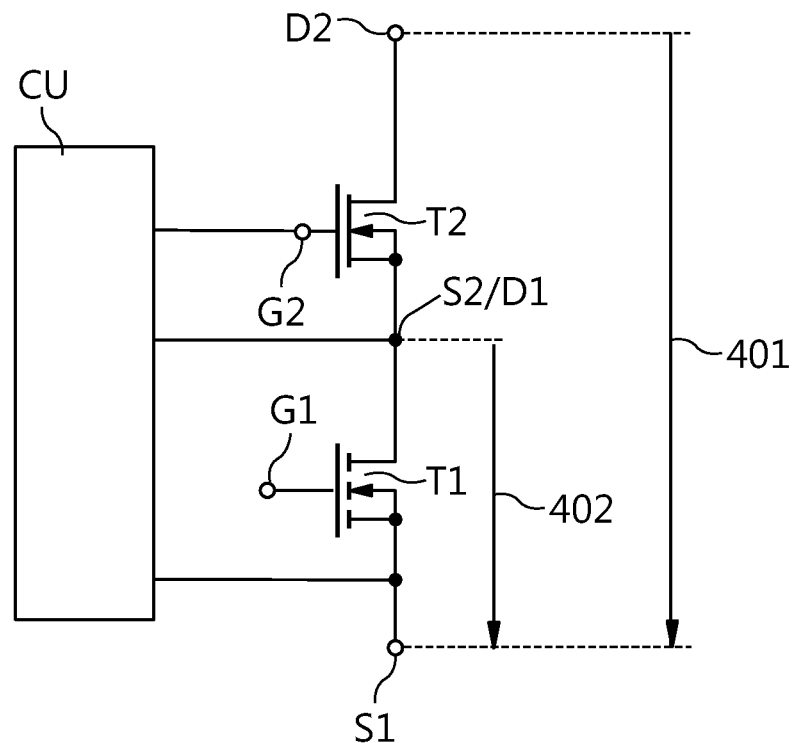
FIG. 6 illustrates a schematic block diagram of a high-voltage semiconductor switch, according to an embodiment.

FIG. 6 illustrates a schematic block diagram of a high-voltage semiconductor switch 100, according to an embodiment which can be described with other embodiments herein. The high-voltage semiconductor switch 100 is designed for switching a high voltage 401 and includes the first field-effect transistor T1 having a source S1, a drain D1 and a gate G1, and being adapted for switching the voltage 402 at a rated high-voltage level. Herein the first field-effect transistor T1 is provided as a normally-off enhancement-mode transistor. Furthermore, the second field-effect transistor T2 having a source S2, a drain D2 and a gate G2 is provided, wherein the second field-effect transistor T2 is connected in series to the first field-effect transistor T1. Thereby the source S2 of the second field-effect transistor T2 is connected to the drain D1 of the first field-effect transistor T1. The second field-effect transistor T2 is provided as a normally-on depletion-mode transistor. A control unit CU is connected to the drain D1 of the first field-effect transistor T1 and to the source S2 of the second field-effect transistor T2, respectively. In addition to that, the gate G2 of the second field-effect transistor T2 and the source S1 of the first field-effect transistor T1 are connected to the control unit CU. Thereby, the control unit CU is operable for blocking the second field-effect transistor T2 if a drain-source voltage 402 across the first field-effect transistor T1 exceeds the rated high-voltage level, as has been described herein above with reference to FIG. 1.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A high-voltage semiconductor switch, comprising:
a first field-effect transistor having a source, a drain and a gate, and adapted for switching a voltage at a rated high-voltage level, wherein the first field-effect transistor is a normally-off enhancement-mode transistor;
a second field-effect transistor having a source, a drain and a gate, connected in series to the first field-effect transistor, wherein the second field-effect transistor is a normally-on depletion-mode transistor; and
a control unit connected to the drain of the first field-effect transistor and to the gate of the second field-effect transistor and operable for blocking the second field-effect transistor if a drain-source voltage across the first field-effect transistor exceeds the rated high-voltage level.

2. The high-voltage semiconductor switch of claim 1, wherein the first field-effect transistor and the second field-effect transistor form a cascode circuit.

3. The high-voltage semiconductor switch of claim 1, wherein the first field-effect transistor is selected from the group consisting of an n-channel MOSFET, a superjunction transistor, a MISFET, an IGBT, a JFET, and a HEMT.

4. The high-voltage semiconductor switch of claim 1, wherein the second field-effect transistor is selected from the group consisting of an n-channel MOSFET, a JFET, and a HEMT.

5. The high-voltage semiconductor switch of claim 1, wherein a first voltage-limiting element is connected in parallel to the source-drain path of the first field-effect transistor.

6. The high-voltage semiconductor switch of claim 1, wherein a second voltage-limiting element is connected in parallel to the source-drain path of the second field-effect transistor.

7. The high-voltage semiconductor switch of claim 1, wherein the control unit comprises a Zener diode and a resistor connected in series between the drain and the source of the first field-effect transistor, wherein a common connection terminal of the Zener diode and the resistor is connected to the gate of the second field-effect transistor.

8. The high-voltage semiconductor switch of claim 7, wherein the Zener diode and the resistor are as discrete circuit elements from the first and second field-effect transistor.

9. The high-voltage semiconductor switch of claim 7, wherein the first field effect transistor, the second field-effect transistor, the Zener diode and the resistor are arranged within a common multi-chip package.

10. The high-voltage semiconductor switch of claim 1, wherein the source of the second field-effect transistor and the drain of the first field-effect transistor are electrically connected to a common node, and wherein the source of the first field-effect transistor is connected to a first terminal and the drain of the second field-effect transistor is connected to a second terminal to supply a voltage to the first and second field-effect transistors.

11. The high-voltage semiconductor switch of claim 1, further comprising a first voltage-limiting element connected between the source and the drain of the first field-effect transistor.

12. The high-voltage semiconductor switch of claim 1, further comprising a second voltage-limiting element connected between the source and the drain of the second field-effect transistor.

13. A high-voltage semiconductor switch, comprising:
an integrated semiconductor device having a cell region, an outer rim, and an edge termination region arranged between the outer rim and the cell region, the semiconductor device comprising:
a first field-effect transistor having a source, a drain and a gate, and being adapted for switching a voltage at a rated high voltage level; and
a Zener diode and a resistor connected in series between the drain and the source of the first field-effect transistor, wherein the Zener diode and the resistor are monolithically integrated in the edge termination region of the integrated semiconductor device; and
a second field-effect transistor having a source, a drain and a gate;

wherein the second field-effect transistor is connected with its source to the drain of the first field-effect transistor;
wherein a connection terminal of the Zener diode and the resistor is connected to the gate of the second field-effect transistor.

14. The high-voltage semiconductor switch of claim 13, wherein the resistor is provided in a polysilicon n+/n−/n+ structure, which is embedded in a dielectric layer in the edge termination region of the integrated semiconductor device.

15. The high-voltage semiconductor switch of claim 13, wherein the Zener diode comprises an n-well region forming a pn-junction with to a p+ region, and wherein the n-well region and the p+ region are embedded in the edge termination region of the integrated semiconductor device.

16. The high-voltage semiconductor switch of claim 15, wherein a breakdown voltage of the Zener diode is defined by a doping level of the n-well region.

17. The high-voltage semiconductor switch of claim 13, further comprising a drain metallization being electrically connected to the drain of the first field-effect transistor.

18. A method of protecting a high-voltage enhancement mode switching transistor against overvoltage, the method comprising:
providing a series connection of an enhancement mode field-effect transistor comprising a source, drain, and gate, and a depletion mode field-effect transistor comprising a source, drain, and gate, wherein the source of the depletion mode field-effect transistor is connected to the drain of the enhancement mode field-effect transistor;
supplying a high voltage between the drain of the depletion mode field-effect transistor and the source of the enhancement mode field-effect transistor;
switching the high voltage in a normal operation mode by applying a switching signal to the gate of the enhancement mode field-effect transistor; and
switching from the normal operation mode to a protection mode by switching-off the depletion mode field-effect transistor if an overvoltage is detected at the drain of the enhancement mode field-effect transistor.

19. The method of claim 18, further comprising providing a control unit connected with the gate of the depletion mode field-effect transistor, wherein the control unit is operable to switch from the normal operation mode where an applied high voltage is switched, to the protection mode where the high-voltage switching operation is blocked.

20. The method of claim 18, further comprising:
acquiring a drain-source voltage of the first field-effect transistor by the control unit; and
providing a control signal for the gate of the second field-effect transistor by the control unit based on the acquired drain-source voltage.

* * * * *

UNITED STATES PATENT AND TRADEMARK OFFICE
CERTIFICATE OF CORRECTION

| | | |
|---|---|---|
| PATENT NO. | : 8,958,189 B1 | Page 1 of 1 |
| APPLICATION NO. | : 13/963383 | |
| DATED | : February 17, 2015 | |
| INVENTOR(S) | : J. Weyers et al. | |

It is certified that error appears in the above-identified patent and that said Letters Patent is hereby corrected as shown below:

In the Claims

Column 14, line 34 (claim 9, line 2) please change "field effect" to -- field-effect --

Column 14, line 60 (claim 13, line 8) please change "high voltage" to -- high-voltage --

Column 15, line 12 (claim 15, line 3) please change "with to a" to -- with a --

Signed and Sealed this
Eighteenth Day of August, 2015

Michelle K. Lee
*Director of the United States Patent and Trademark Office*